United States Patent
Bouche et al.

(10) Patent No.: US 10,586,762 B2
(45) Date of Patent: Mar. 10, 2020

(54) INTERRUPTED SMALL BLOCK SHAPE

(71) Applicant: GLOBALFOUNDRIES INC., Grand Cayman (KY)

(72) Inventors: Guillaume Bouche, Brussels (BE); Lars W. Liebmann, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/860,171

(22) Filed: Jan. 2, 2018

(65) Prior Publication Data
US 2019/0206787 A1    Jul. 4, 2019

(51) Int. Cl.
*H01L 23/522* (2006.01)
*H01L 21/28* (2006.01)
*H01L 23/538* (2006.01)

(52) U.S. Cl.
CPC ...... *H01L 23/522* (2013.01); *H01L 21/28123* (2013.01); *H01L 23/538* (2013.01)

(58) Field of Classification Search
CPC ............. H01L 23/522; H01L 21/28123; H01L 23/538; H01L 21/76838–76895; H01L 21/76895; H01L 23/5329–53295; H01L 21/76801–76837; G11C 5/06–10
See application file for complete search history.

(56) References Cited

U.S. PATENT DOCUMENTS

| | | |
|---|---|---|
| 3,940,159 A | 2/1976 | Pringle |
| 3,941,221 A | 3/1976 | Pringle |
| 6,677,171 B1 * | 1/2004 | Nagata ................. G02F 1/1309 257/E27.111 |
| 7,531,270 B2 | 5/2009 | Buck et al. |
| 9,633,906 B2 | 4/2017 | Cai et al. |
| 9,704,754 B1 | 7/2017 | Bao et al. |

* cited by examiner

*Primary Examiner* — Tucker J Wright
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to interrupted small block shape structures (e.g., cut metal lines forming cell boundaries) and methods of manufacture. The structure includes: a plurality of wiring lines with cuts that form a cell boundary; and at least one wiring line extending beyond the cell boundary and which is continuous from cell to cell.

7 Claims, 8 Drawing Sheets

INTERRUPTED SMALL BLOCK SHAPE

FIELD OF THE INVENTION

The present disclosure relates to semiconductor structures and, more particularly, to interrupted small block shape structures (e.g., cut metal lines forming cell boundaries) and methods of manufacture.

BACKGROUND

Fabricating smaller, more densely packed devices having greater computing capability is a continuing objective in building semiconductor devices. For example, scaling of devices has been instrumental in improvements in speed, power consumption and utilization of expensive area on a chip. However, as newer technology nodes are being designed, scaling of features is becoming more problematic.

To improve area scaling as pitch scaling slows, track count of the standard cell libraries can be reduced. However, track reduction beyond 6 T (6 tracks) is difficult due to lithographic overlay tolerances which can short wiring lines. For example, cut metal lines need to be separated to ensure that devices do not short together; however, conventional photolithographic processes cannot keep up with the current scaling, effectively consuming valuable area on the chip and allowing overlay issues that result in shorting.

SUMMARY

In an aspect of the disclosure, a structure comprises: a plurality of wiring lines with cuts that form a cell boundary; and at least one wiring line extending beyond the cell boundary and which is continuous from cell to cell In an aspect of the disclosure, a method comprises: defining a pattern in a first mask over a dielectric material; defining a pattern in a second mask, superimposed over the first mask; etching a layout within the dielectric material which includes trenches corresponding to the pattern in the second mask and interruptions in the trenches corresponding to the pattern of the first mask; and filling the trenches with metal material to form at least cut wiring structures defining a cell boundary.

In an aspect of the disclosure, a method comprising: defining a pattern in a first mask over a dielectric material, comprising: depositing a block material on the dielectric material; patterning the block material with a lithography step to form an outline of a cell boundary and a notched shape having a dimension of at least a width of a metal line; forming a material over the patterned block material and within the notched feature; anisotropically etching the material to form an overhang on the block material and covering a portion of the notched feature; etching exposed portions of the block material with the overhang protecting the dielectric material and block material underneath the overhang from being etched; and removing the overhang leaving the pattern in the first mask having a width dimension of the overhang; defining a pattern in a second mask, superimposed over the pattern of the first mask; etching a layout within the dielectric material corresponding to the superimposed pattern of the second mask, with the first mask protecting the dielectric material from being etched; and filling the layout with metal material to form at least cut wiring structures defining a cell boundary defined by the pattern in the first mask.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to interrupted small block shape structures (e.g., cut lines forming a cell boundary) and methods of manufacture. More specifically, the present disclosure is directed to the fabrication processes of a cell structure with cut metal lines and a cell boundary formed by a pattern of the cut metal lines. Advantageously, the cell structure and, more specifically, the cell boundary, can be formed in smaller technology nodes while using less masking steps than in conventional fabrication processes.

In embodiments, the cell structure with cut metal lines and cell boundary can be formed with two lithography steps. In embodiments, for example, the lithography steps will also define at least one metal line pass (escape) which extends beyond the cell boundary (and which is longer than the cut metal lines within the cell boundary). For example, a first lithography step will be used to form a mask of a cell boundary (e.g., cut metal lines mask) and a second lithography step will be used to form a mask of metal lines with a mid-track cut. In addition, the combination of the first lithography step and the second lithography step is used to fabricate the at least one metal line pass.

In more specific embodiments, the features described herein, e.g., cut metal lines which form a cell boundary and at least one metal line pass (escape), can be formed by using a combination of a first mask with an opening (formed by a notched patterned feature) and a second mask with wiring features. By overlaying the second mask on the first mask, it is possible to pattern the features in a single etching step within a dielectric layer. By way of more specific example, a discontinuous spacer (one lithography step and double spacer process) is used to pattern a block hardmask with cuts for metal lines (to form the cell boundary) and at least a discontinuity (opening) to form, in combination with a second mask, the metal line pass (escape). In embodiments, the at least one metal line pass can be two or more metal line passes which form a continuous metal line from cell to cell. On the other hand, the cut metal lines are interrupted at the cell boundary where the interruption is equal or larger than a minimum critical dimension required for reliability, e.g., 5 nm and smaller than what direct print lithography is capable of, e.g. 18 nm for Extreme Ultra Violet (EUV) printing of a line grating at pitch smaller than 36 nm.

Accordingly, by implementing the processes described herein, it is now possible to shrink technology nodes with metal cuts provided with a single cell height, e.g., single metal line cut at a critical dimension. The processes described herein can also drive down cell height, e.g., to a 5 track library, while still allowing for vertical metal wiring routing (escapes) where needed.

The cell structures of the present disclosure can be manufactured in a number of ways using a number of different tools. In general, though, the methodologies and tools are used to form structures with dimensions in the micrometer and nanometer scale. The methodologies, i.e., technologies, employed to manufacture the cell structure of the present disclosure have been adopted from integrated circuit (IC) technology. For example, the structures are built on wafers and are realized in films of material patterned by photolithographic processes on the top of a wafer. In particular, the fabrication of the cell structures use three basic building blocks: (i) deposition of thin films of material on a substrate, (ii) applying a patterned mask on top of the films by photolithographic imaging, and (iii) etching the films selectively to the mask.

Figure 1:
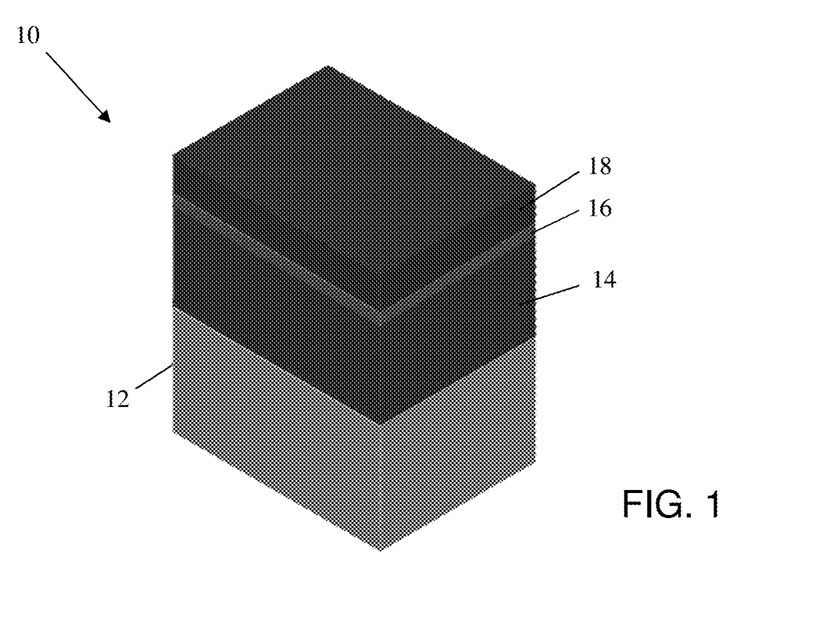
FIG. 1 shows a layered structure and respective fabrication processes in accordance with aspects of the present disclosure.

FIG. 1 shows a layered structure and respective fabrication processes in accordance with aspects of the present disclosure. In embodiments, the layered structure 10 includes a substrate 12 composed of, e.g., semiconductor material, with active and/or passive devices. By way of example, the substrate 12 can be composed of any suitable material including, but not limited to, Si, SiGe, SiGeC, SiC, GaAs, InAs, InP, and other III/V or II/VI compound semiconductors. In embodiments, the devices can be, e.g., transistors, resistors, capacitors, etc.

Still referring to FIG. 1, a dielectric material 14 is deposited on the substrate 12. The dielectric material 14 can be an interlevel dielectric material, e.g., oxide material, deposited by a conventional deposition method, e.g., chemical vapor deposition (CVD) process. A hardmask material 16 (e.g., block hardmask composed of TiN) is deposited on the dielectric material 14. As will be appreciated, in subsequent processes the hardmask material 16 will be used to pattern a cell boundary and at least one metal line pass (escape) which extends outside the cell boundary in the dielectric material 14. A sacrificial material 18 (e.g., amorphous Si) is deposited on the hardmask material 16. Both the hardmask material 16 and the sacrificial material 18 can be blanket deposited using a conventional deposition process, e.g., CVD or Physical Vapor Deposition (PVD).

Figure 2:
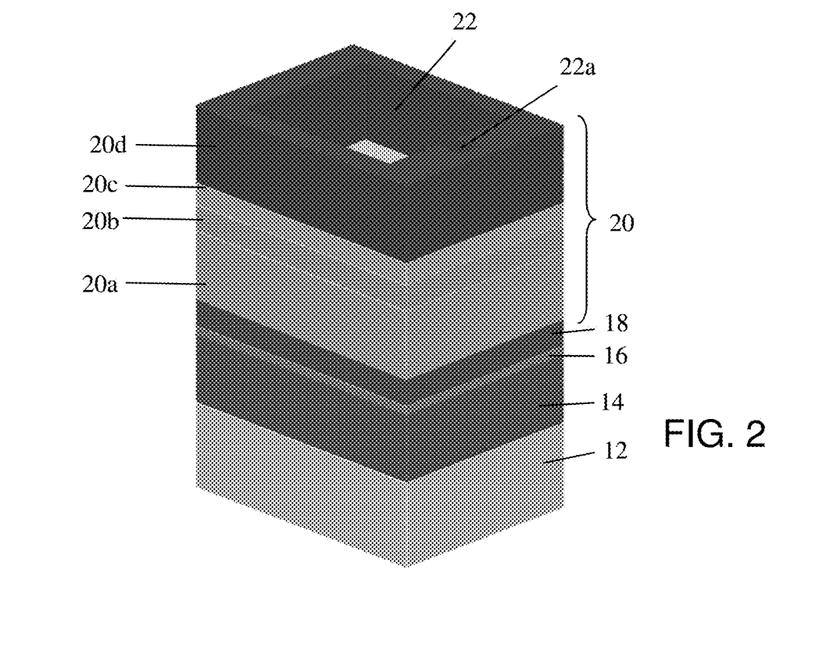
FIG. 2 shows a lithography stack, amongst other features, and respective fabrication processes in accordance with aspects of the present disclosure.

In FIG. 2, a lithography stack 20 is formed on the sacrificial material 18. The lithography stack 20 can include several layers including, e.g., an organic spin on material 20a (carbon), an insulator layer 20b (e.g., SiON), an anti-reflective coating (ARC) 20c and a photoresist 20d. It should be recognized by those of ordinary skill in the art, though, that other layers in the lithography stack can be utilized in accordance with aspects of the present disclosure and that layers 20a, 20b, 20c, 20d are not meant to be a limiting feature.

The lithography stack 20 includes a pattern 22 with a notched feature 22a, formed by exposing the lithography stack 20 to energy (light), exposing the lithography stack 20 to a development process and subsequently to an etching process, e.g., RIE, as needed. The pattern 22 can correspond to an outline of a cell boundary with the notched feature 22a representing a pitch of at least one track width, e.g., a width of a wiring structure corresponding to the width of one metal line and associated space to the neighboring line in a regular grating, to be used, at least partly, to define the at least one metal line pass (escape) in the dielectric material 14.

In more specific embodiments, the pattern 22 can be a polygon shape representing the edges of a cell boundary, although other shapes are contemplated herein depending on the design criteria. The notched feature 22a, on the other hand, can represent a width of at least one wiring structure pass and, in further embodiments, a pitch of two adjacent wiring structure passes, for example. In embodiments, although the lithography stack 20 is shown to have squared corners (e.g., 90° corners), it should be recognized that the corners can also be slightly rounded.

Figure 3:
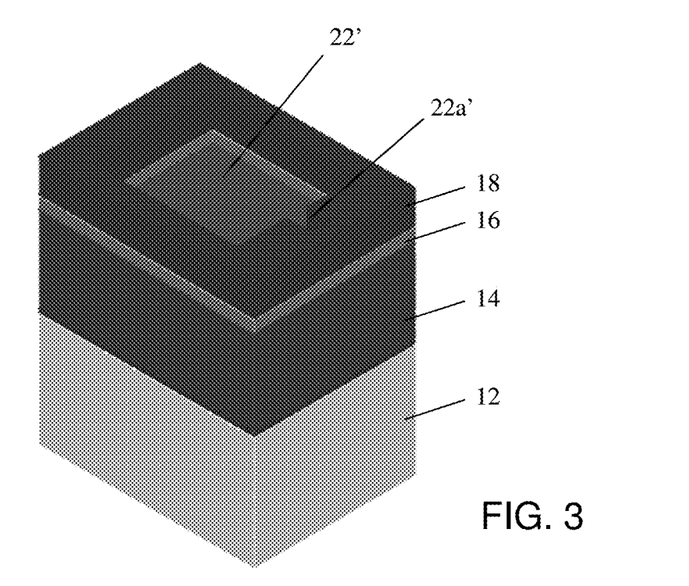
FIG. 3 shows a pattern in a hardmask material, amongst other features, and respective fabrication processes in accordance with aspects of the present disclosure.

As shown in FIG. 3, an etching process with a selective chemistry, e.g., reactive ion etching (RIE), is performed to transfer the pattern 22, 22a into the sacrificial material 18 and the dielectric material 16, resulting in pattern 22', 22a'. Again, for example, the pattern 22' is representative of an outline of a cell boundary; whereas, the pattern 22a' is a width of at least one wiring structure pass. After the etching process, the layers of the lithography stack 20 can be removed using conventional stripping processes. For example, the photoresist 20d can be removed by a conventional oxygen ashing process or using other known stripants.

Figure 4:
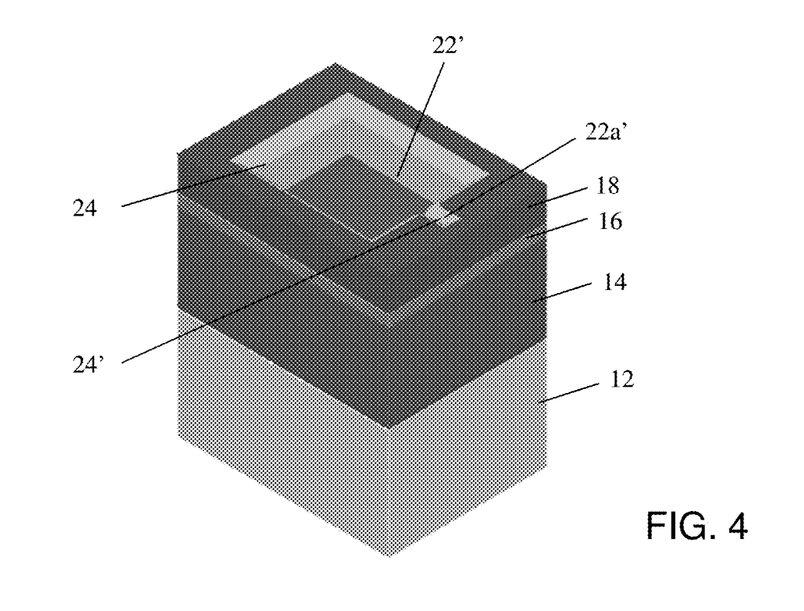
FIG. 4 shows a sidewall spacer material deposited on the patterned hardmask material, amongst other features, and respective fabrication processes in accordance with aspects of the present disclosure.

In FIG. 4, a sidewall spacer material 24 is blanket deposited within the pattern (opening) 22', 22a', followed by an anisotropic (RIE) etching process to remove the spacer material on horizontal surfaces, e.g., exposed surfaces of the dielectric material 14 and sacrificial material 18. The anisotropic etching process will leave the sidewall spacer material 24 on the sidewalls of the opening 22', while plugging the notched feature 22a' as shown representatively at reference numeral 24'. In embodiments, the sidewall spacer material 24 can be a nitride material (or other material that presents selectivity at etch with the adjacent masking material 16), deposited by conventional atomic layer deposition (ALD) conformal processes. The thickness of the sidewall spacer material 24 should be sufficient to plug the notched features 22a' to ensure that an opening will remain within the final pattern of the hardmask material 16 (as further described herein). As should be understood by those of ordinary skill in the art, the sidewall spacer material 24 on the sidewalls of the pattern 22' will reset a shape of a cell boundary, e.g., a rectangular shape along a cell boundary.

Figure 5:
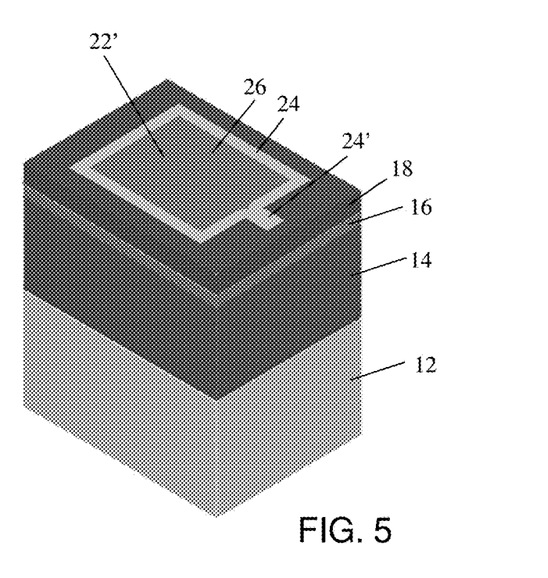
FIG. 5 shows a material filling a remaining portion of the pattern of the patterned hardmask material, amongst other features, and respective fabrication processes in accordance with aspects of the present disclosure.

In FIG. 5, a material 26 will fill the remaining portion of the opening 22' (adjacent to the sidewall spacer material 24). The material 26 can be an organic material and, more specifically, a spin on organic material. In alternative embodiments, the material 26 can be any material that will fill the pattern (opening) 22' and which has an etch selectivity to at least the sidewall spacer material 24 and the sacrificial material 18. The material 26 can be etched back to form a planar surface with the sidewall spacer material 24 and the sacrificial material 18.

Figure 6:
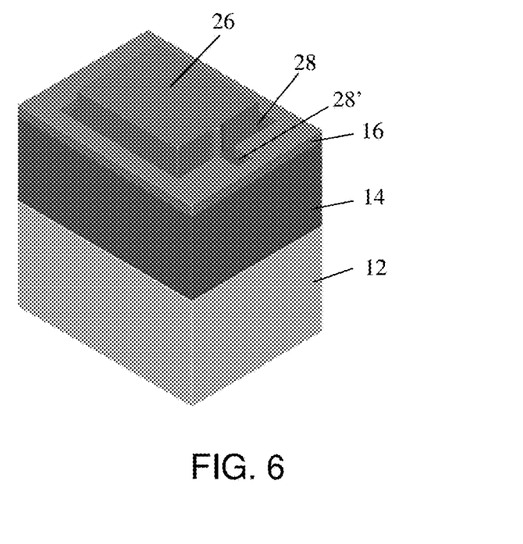
FIG. 6 shows a pattern in an underlying masking material, amongst other features, and respective fabrication processes in accordance with aspects of the present disclosure.

As shown in FIG. 6, the sacrificial material 18 and the sidewall spacer material 24 are selectively removed with respect to the underlying masking material 16, the material 26 and the underlying dielectric material 14. In embodiments, the removal of the sacrificial material 18 and the sidewall spacer material 24 can be performed by a conventional RIE process, with chemistries selective to such materials. In this way, the underlying masking material 16, the material 26 and the dielectric material 14 will remain after the etching process, leaving a pattern 28, 28' which will match an outline of the cell boundary and a width of at least one metal line pass (e.g., features 28'). As should be recognized by those of skill in the art, patterned feature 28' will coincide with the shape of the notched feature 22a, ultimately resulting in an opening formed in the final pattern of the masking material 16.

Figures 7A, 7B:
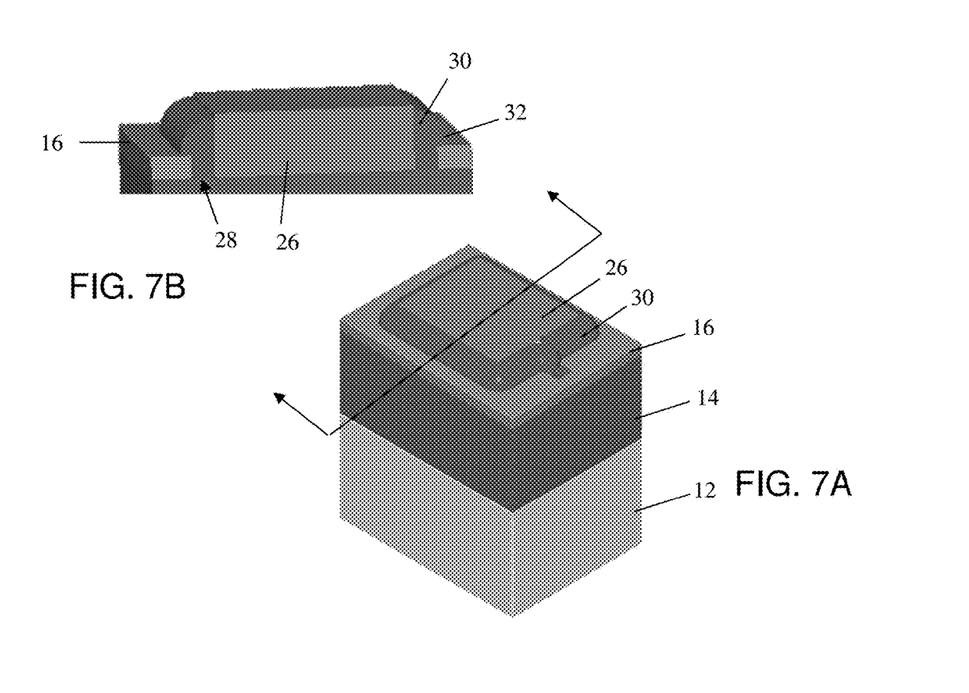
FIG. 7A shows a perspective view of masking material with an overhang feature, amongst other features, and respective fabrication processes in accordance with aspects of the present disclosure.
FIG. 7B shows a cross-sectional view of FIG. 7A.

FIG. 7A shows a perspective view of a spacer material filling the pattern 28, 28', e.g., a pattern representing an edge of a cell boundary and width of at least one metal line pass, with an overhang on the masking material 16. FIG. 7B shows a cross-sectional view of FIG. 7A. Referring to both FIGS. 7A and 7B, a conformal material 30 is deposited over the pattern 28, 28' and any exposed surfaces, e.g., surfaces of the underlying masking material 16 and the material 26. The conformal material 30 can be a nitride material deposited by an ALD process, which is a well-controlled process allowing deposition of the material 30 to a well-defined thickness, e.g., accuracy down to 1 nm. In more specific embodiments, the thickness of the material 30 is greater than the sidewall spacer material 24 (which has been removed), thereby completely filling the pattern 28, 28'.

Still referring to FIGS. 7A and 7B, the material 30 undergoes an anisotropic etching process. In this anisotropic RIE etching process, the material 30 will be removed from the exposed surfaces of the underlying masking material 16 and the material 26, leaving a slight overhang 32 on the underlying masking material 16. This slight overhang 32 will define the cell boundary (cuts in metal lines), e.g., about 18 nm or smaller. For example, in embodiments, the cell boundary will be formed by transferring the dimensions of the slight overhang 32 onto the underlying masking material 16 and, thereafter, into the dielectric material 14. The transfer of the pattern (e.g., width and shape) of the overhang feature into the dielectric material 14 will form cuts of minimal width critical dimensions in metal lines. The cut in the metal lines, in turn, forms the cell boundary of minimal critical dimensions. On the other hand, the material that fills the pattern 28' will correspond with a width of the least one metal line pass extending outside of the cell boundary, e.g., passing from cell to cell.

Figure 8:
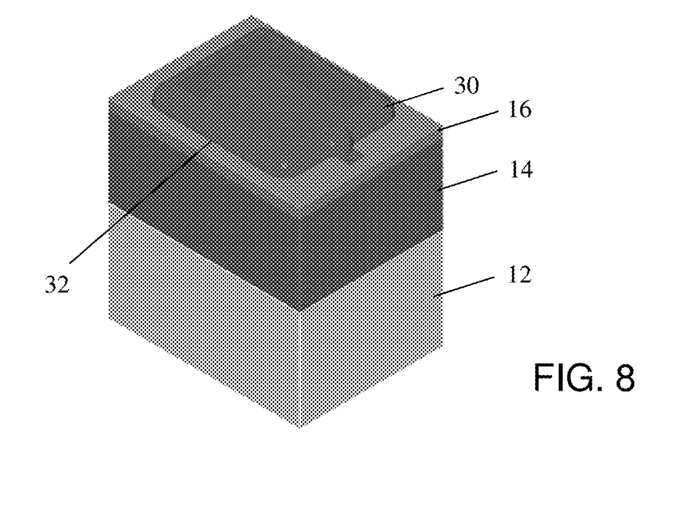
FIG. 8 shows the overhang feature above an underlying masking material, amongst other features, and respective fabrication processes in accordance with aspects of the present disclosure.

As further shown in FIG. 8, the material 26 is removed, leaving the material 30 and overhang 32, amongst other materials, e.g., partially patterned hardmask material 16 and underlying dielectric material 14. In embodiments, during the removal of the material 26, the material 30 on the dielectric material 14 and overhang 32 on the hardmask material 16 will be used to protect the underlying materials, e.g., dielectric material 14 and hardmask material 16. In embodiments, the material 26 can be removed by a conventional stripping technique for organic materials, which will not erode the underlying dielectric material 14.

Figure 9:
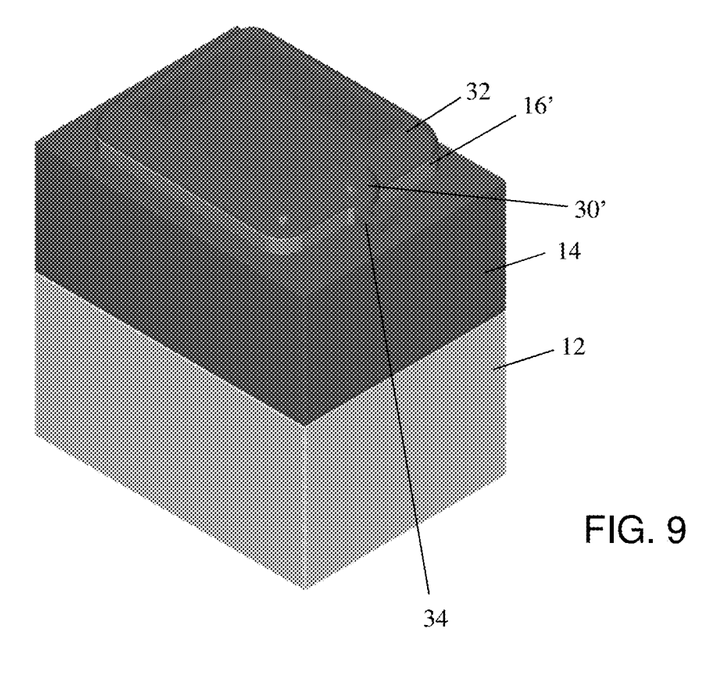
FIG. 9 shows the overhang feature transferred onto the underlying masking material, amongst other features, and respective fabrication processes in accordance with aspects of the present disclosure.

In FIG. 9, the hardmask material 16 is patterned again using this time the overhang 32 as a mask, e.g., the overhang 32 will protect portions of the hardmask material 16. This etch is anisotropic. In this way, the shape of the overhang 32 can be transferred to the now fully patterned hardmask material 16' which, in turn, will correspond to a width of a cell boundary, e.g., cuts within metal lines that form the cell boundary. In addition, the processes thus far described will also result in an opening 34 in the patterned hardmask material 16' which, in turn, will correspond to at least a width of a metal line pass or, in embodiments, a width of the metal line pass and space on both sides thereof. The opening 34 can also correspond to a pitch of two metal line passes, e.g., 2 tracks. The hardmask material 16 can be patterned by a conventional etching process, e.g., RIE etch for a TiN material. As should be understood, the opening 34 is a result of the notched feature originally formed in the hardmask material 16.

Figure 10:
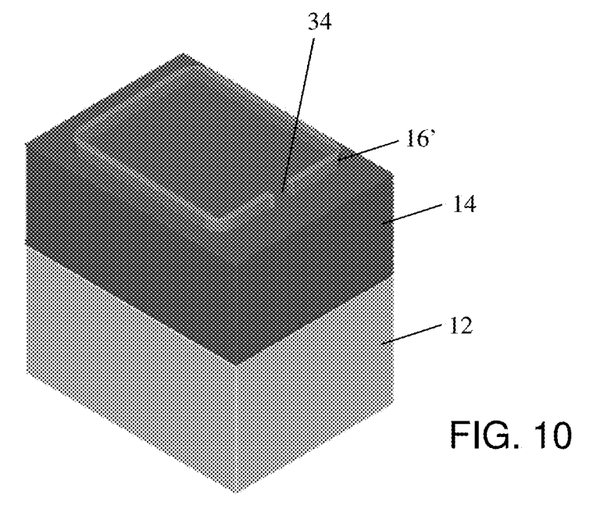
FIG. 10 shows the patterned underlying masking material (without the overhang feature), amongst other features, and respective fabrication processes in accordance with aspects of the present disclosure.

FIG. 10 shows the removal of the overhang 32, which results in the fully patterned hardmask material 16' with the opening 34 being left on the dielectric material 14. As should now be understood by those of skill in the art, the fully patterned hardmask material 16' will correspond to the cell boundary, with the width of the fully patterned hardmask material 16' being used to form cuts in metal wires, in subsequent processing steps. In addition, the opening 34 of the fully patterned hardmask material 16' will correspond to at least one metal line pass which will extend outside of the cell boundary. The metal line pass will be longer than other metal lines which are cut within the cell boundary.

Figure 11:
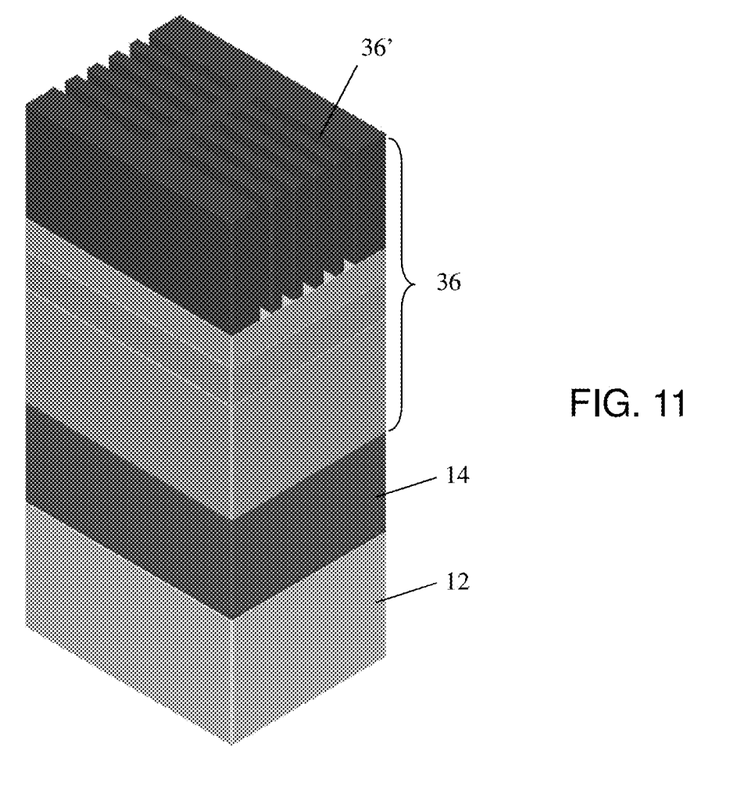
FIG. 11 shows a lithographic stack overlaid on the patterned underlying masking material, amongst other features, and respective fabrication processes in accordance with aspects of the present disclosure.

FIG. 11 shows a lithography stack 36 formed on the patterned hardmask material 16' and dielectric material 14. In embodiments, the lithography stack 36 can be similar to lithography stack 20, but with a pattern 36' corresponding to wiring structures, e.g., wiring lines. In combination with the patterned hardmask material 16', the pattern 36' will correspond in shape (e.g., length, width, etc.) with the cell boundary, cut metal wires and the at least one metal line pass which will extend outside of the cell boundary.

Figure 12:
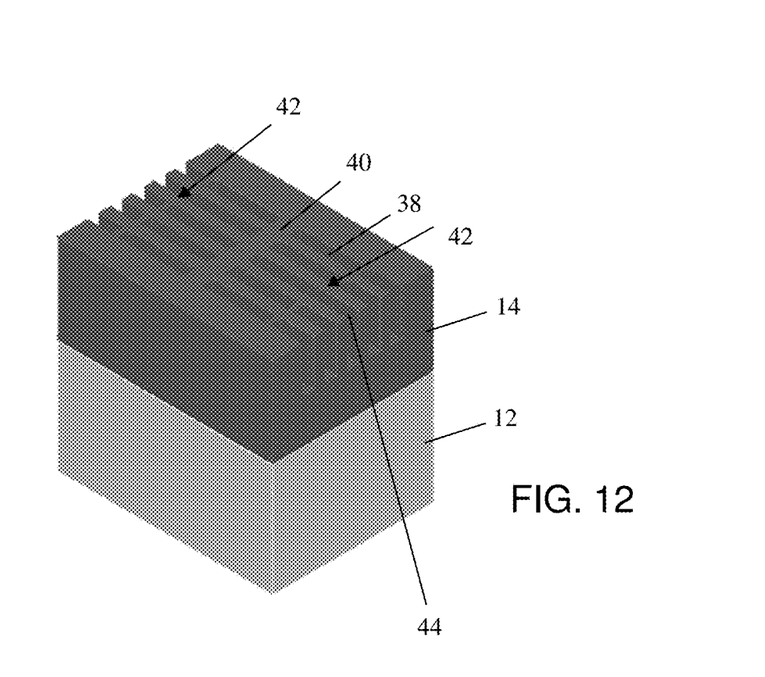
FIG. 12 shows a patterned layout in a dielectric material, amongst other features, and respective fabrication processes in accordance with aspects of the present disclosure.

FIG. 12 shows a layout of trenches for cut metal wires 38, a mid-track cut 40, a cell boundary 42, and a metal line pass 44, transferred from the pattern 36' of the lithography stack 36 and the patterned hardmask material 16'. By way of example, the layout shown in FIG. 12 is formed by a conventional etching process using both the pattern 36' of the lithography stack 36 and the patterned hardmask material 16'. As should be understood by those of ordinary skill in the art, the layout includes a plurality trenches 38, 44 which will be filled with metal material in subsequent fabrication processes to form cut metal lines and at least one metal line pass that extends outside from the cell boundary 42. The trenches 38, which are used to form the cut metal lines, are interrupted at the cell boundary where the interruption is equal or smaller than 18 nm, as an example. In other examples, the interruption is a minimum critical dimension needed for reliability.

Referring still to FIG. 12, as should now be understood by those of skill in the art, the trenches 38 correspond with the pattern 36' of the lithography stack 36, with a ridge in dielectric material representing a mid-track cut 40. In embodiments, the mid-track cut 40 is wide enough to be directly printed from the pattern 36' of the lithography stack 36, e.g., about 20 nm to 30 nm. The cell boundary 42 is effectively cuts in the metal lines (e.g., a space between the trenches) which cannot be directly printed from the pattern 36' of the lithography stack 36 because it is too narrow and beyond the capability of current lithography processes. Instead, the cell boundary 42 coincides in shape, e.g., length, width, etc., of the patterned hardmask material 16', which protects the dielectric material 14 during the etching of the layout in the dielectric material 14. In embodiments, the cut metal lines interrupt the metal lines, themselves, which effectively form the cell boundary 42.

In this implementation, the cell boundary has a width or dimension of a minimum critical dimension needed for reliability. For example, the minimum critical dimension of the interruption can be 18 nm or smaller, e.g., 10 nm but larger than 5 nm. In addition, the combination of the pattern 36' and the opening 34 in the patterned hardmask material 16' will form the trench 44 which, when filled with metal material, will form at least one metal line pass extending outside of the cell boundary 42. The trench 44 extends outside of the cell boundary 42 and, more specifically, is continuous from cell to cell.

Figure 13A:
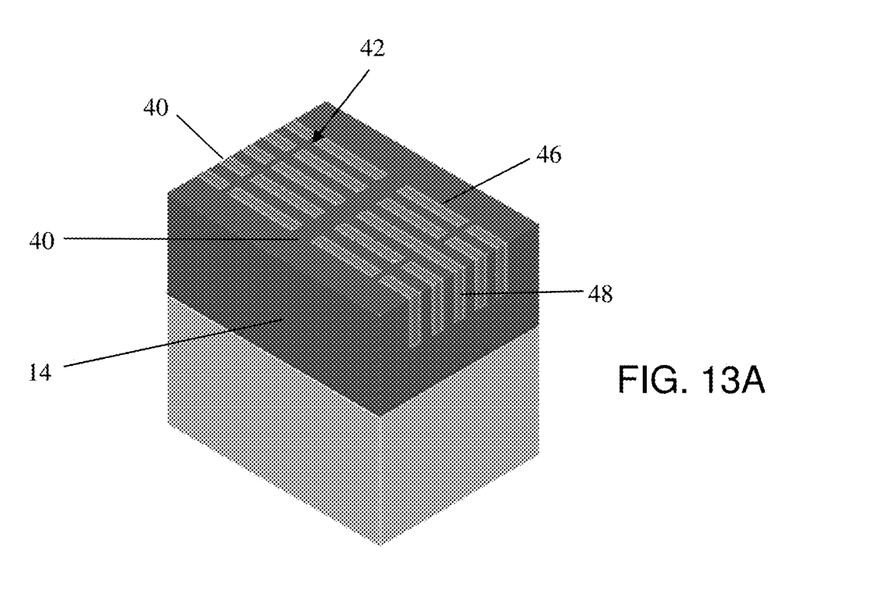
FIGS. 13A and 13B show metal features coinciding within the layout of the dielectric material forming, e.g., cut wires, a cell boundary and at least one metal line pass, amongst other features, and respective fabrication processes in accordance with aspects of the present disclosure.
Figure 13B:
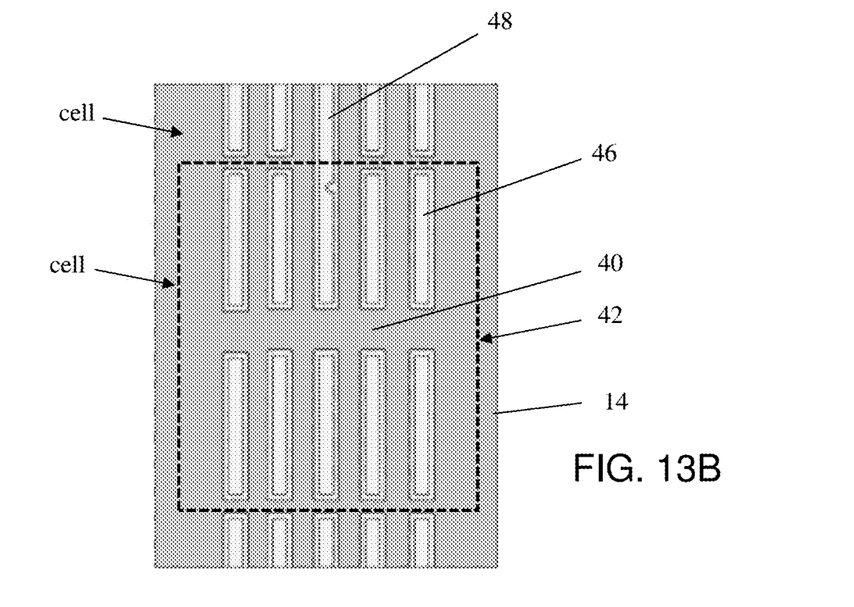

FIG. 13A shows a perspective view of cut metal lines 46 and the at least one metal line pass 48 extending outside of the cell boundary 42. FIG. 13B shows a top view of the cut metal lines 46 and the at least one metal line pass 48 extending outside of the cell boundary 42. In embodiments, after removal of the lithography stack, metal material is deposited within the trenches 38, 44 of the dielectric material 14 to form the cut metal lines 46 and the at least one metal line pass 48. In embodiments, the metal material filling the trenches can be any appropriate metal material used for wiring lines, e.g., copper, aluminum, tungsten, etc., deposited using conventional deposition methods. For example, copper material can be deposited by an electroplating process, e.g., copper material; whereas, aluminum can be deposited by a CVD process. Prior to metal filling, an appropriate barrier and liner stack of thin films is deposited, for example, a combination of two films among: TiN, TaN, PVD Cu, Cobalt or Ruthenium. Following the metal fill deposition process, the metal material can be planarized by, e.g., chemical mechanical polishing (CMP).

As further seen in FIGS. 13A and 13B, the cut metal lines 46 are formed within the cell boundary 42 by depositing metal material within the trenches 38. The cut metal lines 46 are separated in the lengthwise direction within the cell boundary 42 by the mid-track cut 40 (e.g., interruption in the dielectric material formed by the patterned lithographic stack). Also, the at least one metal line pass 48 is fabricated by filling trench 44. The at least one metal line pass 48 extends outside of the cell boundary 42 and, more specifically, will form a continuous metal line from cell to cell.

Figure 14A:
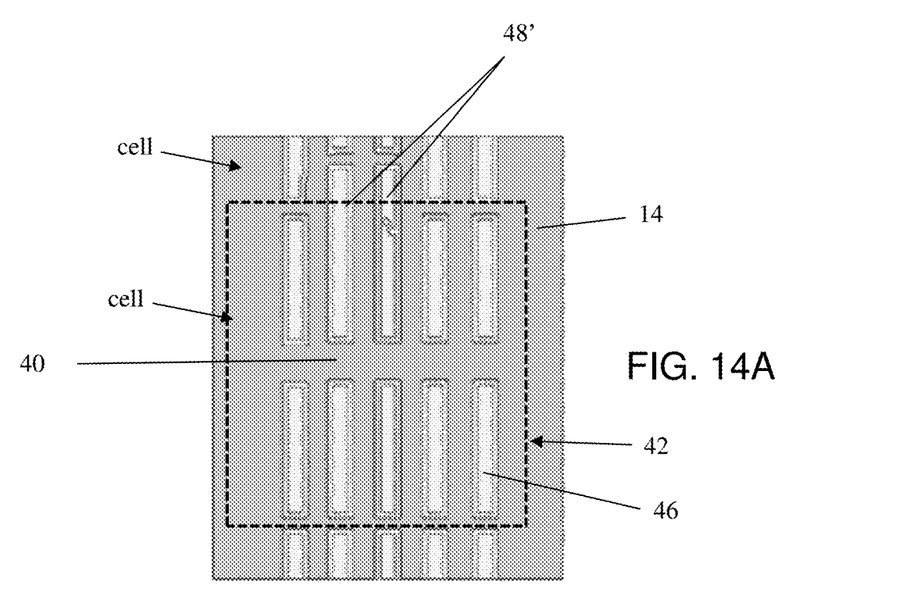
FIGS. 14A and 14B show metal features forming cut wires, a cell boundary and two metal line passes, amongst other features, and respective fabrication processes in accordance with additional aspects of the present disclosure.
Figure 14B:
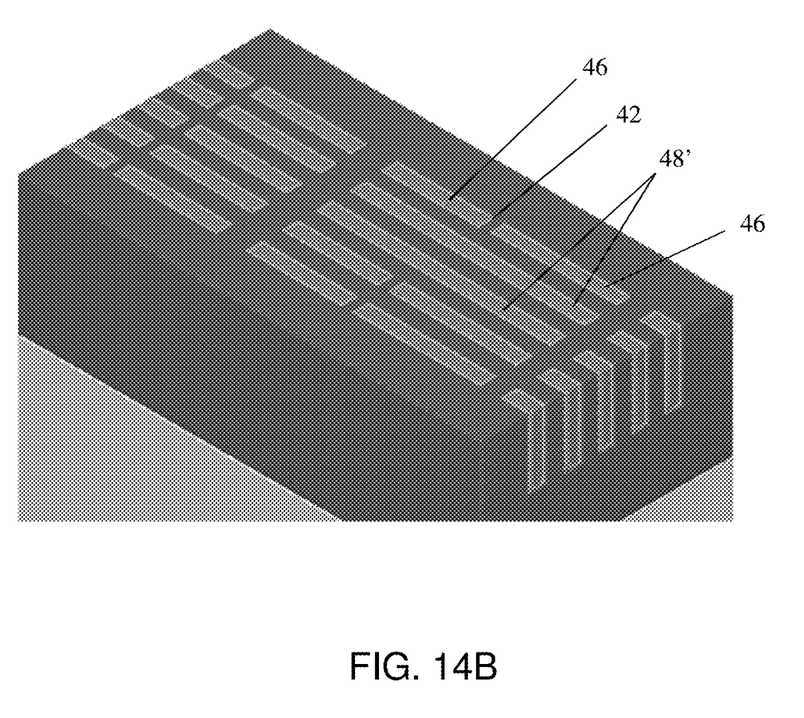

FIG. 14A shows a top view of the cut metal lines 46 and the two metal line passes 48' extending outside of the cell boundary 42. FIG. 14B shows a perspective view of cut metal lines 46 and the two metal line passes 48' extending outside of the cell boundary 42. It should be recognized by those of skill in the art that the layout shown in FIGS. 14A and 14B can be fabricated in the same manner as shown with respect to the structures shown in FIGS. 1-13B, with the exception that the initial notched pattern would be larger which, in turn, would result in a larger opening (e.g., opening 34 in the patterned hardmask material 16') of the patterned hardmask material 16' to accommodate two metal line passes 48'.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
a plurality of wiring lines with cuts composed of dielectric material that extends between the plurality of wires along their longitudinal axis, the cuts form a cell boundary; and
at least one wiring line extending beyond the cell boundary and which is continuous from cell to cell, wherein:
the cell boundary is further defined by the dielectric material running parallel to the plurality of wiring lines with cuts;
the at least one wiring line extending beyond the cell boundary is cut in a continuous cell; and
the at least one wiring line extending beyond the cell boundary and the plurality of wiring lines with cuts are metal features within trenches of the dielectric material.

2. The structure of claim 1, wherein the at least one wiring line extending beyond the cell boundary and the plurality of wiring lines with cuts are metal features on a same wiring level.

3. The structure of claim 2, wherein the plurality of wiring lines are separated from the cell to cell in a lengthwise direction within the cell boundary.

4. The structure of claim 3, wherein the plurality of wiring lines in a lengthwise direction within the cell boundary are separated by a mid-track cut.

5. The structure of claim 4, wherein the mid-track cut and the cut are on a same wiring layer as the at least one wiring line extending beyond the cell boundary and the plurality of wiring lines.

6. The structure of claim 5, wherein the mid-track cut and the cut are parallel to one another.

7. A structure comprising: a plurality of wiring lines with cuts composed of dielectric material that extends between the plurality of wires along their longitudinal axis, the cuts form a cell boundary; and at least one wiring line extending beyond the cell boundary and which is continuous from cell to cell, wherein: the cell boundary is further defined by the dielectric material running parallel to the plurality of wiring lines with cuts; the at least one wiring line extending beyond the cell boundary and the plurality of wiring lines with cuts are metal features on a same wiring level, and the cuts and the plurality of wiring lines are defined in a pattern in a second mask, superimposed under a first mask.

\* \* \* \* \*